US012662170B2

(12) United States Patent
Chien et al.

(10) Patent No.: US 12,662,170 B2
(45) Date of Patent: Jun. 23, 2026

(54) PATH PLANNING METHOD USING VEHICLE RISK MODEL TRAINED ON MANUAL INTERVENTION DRIVING DATA

(71) Applicant: HON HAI PRECISION INDUSTRY CO., LTD., New Taipei (TW)

(72) Inventors: Shih-Chao Chien, New Taipei (TW); Chin-Pin Kuo, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 110 days.

(21) Appl. No.: 18/606,147

(22) Filed: Mar. 15, 2024

(65) Prior Publication Data

US 2025/0222962 A1    Jul. 10, 2025

(30) Foreign Application Priority Data

Jan. 9, 2024    (CN) .......................... 202410032894.6

(51) Int. Cl.
*B60W 60/00* (2020.01)
*G06F 30/27* (2020.01)

(52) U.S. Cl.
CPC ......... *B60W 60/0059* (2020.02); *G06F 30/27* (2020.01); *B60W 2556/10* (2020.02)

(58) Field of Classification Search
None
See application file for complete search history.

(56) References Cited

U.S. PATENT DOCUMENTS

| | | | |
|---|---|---|---|
| 12,084,085 | B1* | 9/2024 | Bagnell ................. B60W 40/09 |
| 12,387,017 | B1* | 8/2025 | Gabrovski ............... G06F 8/71 |
| 2023/0192132 | A1* | 6/2023 | Oh ...................... B60W 30/095 701/26 |
| 2023/0339502 | A1* | 10/2023 | Chi-Johnston ......... G06N 20/00 |

FOREIGN PATENT DOCUMENTS

CN            114590273            6/2022

* cited by examiner

*Primary Examiner* — Brian P Sweeney
*Assistant Examiner* — Jonathan E Reinert
(74) *Attorney, Agent, or Firm* — ScienBiziP, P.C.

(57) ABSTRACT

A vehicle risk model training method applied to an autonomous vehicle. The vehicle risk model training method comprises obtaining driving data from the autonomous vehicle and environmental perception data, wherein the driving data comprises actual driving data and planned driving data generated by an vehicle risk model of the autonomous vehicle, setting data differences between the actual driving data and the planned driving data as a manual intervention driving data, determining a first perception data matching with the manual intervention driving data in the environmental perception data, and determining risk level information matching with the manual intervention driving data according to the first perception data, and training the vehicle risk model based on the risk level information, the first perception data, the planned driving data, and the manual intervention driving data. A vehicle device and a path planning method are also disclosed.

4 Claims, 4 Drawing Sheets

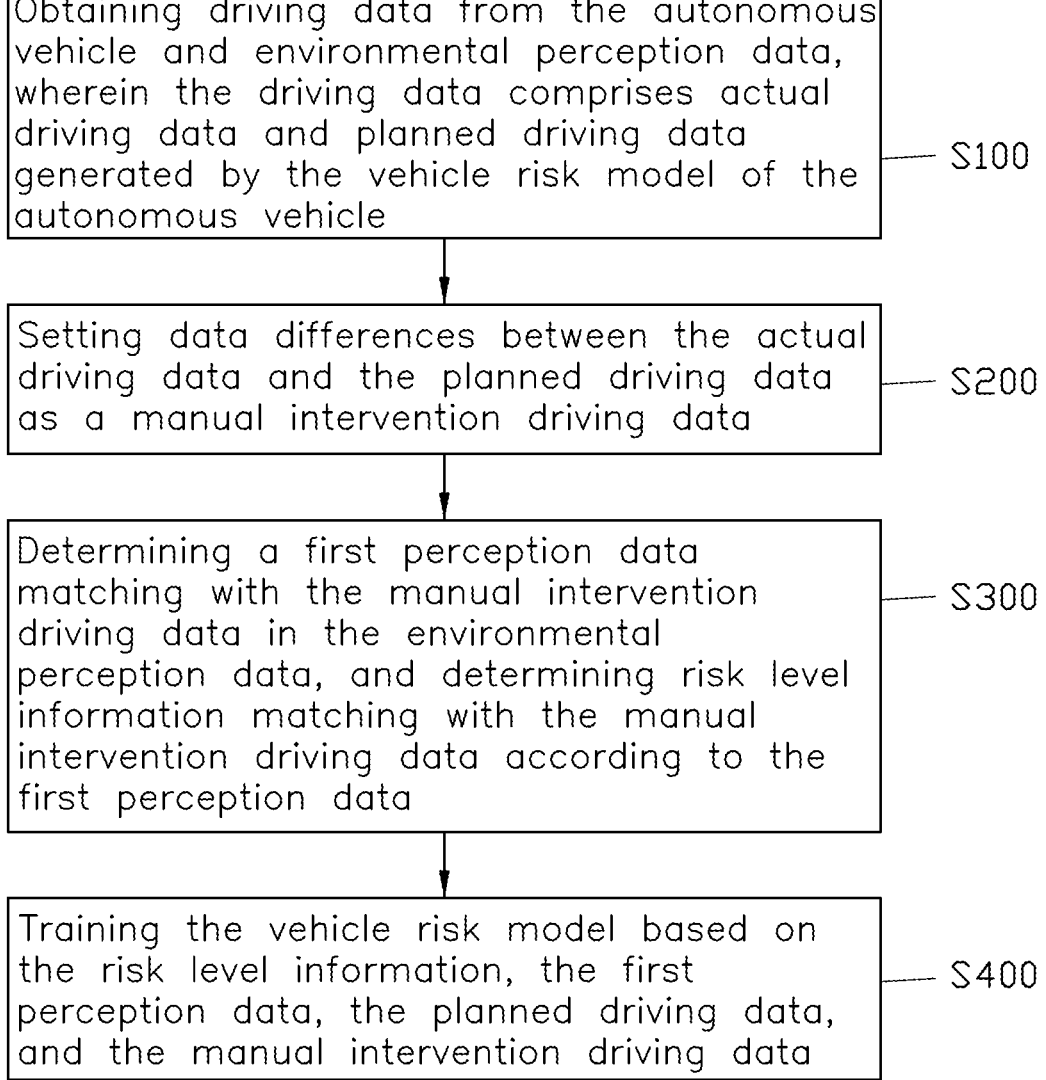

Obtaining driving data from the autonomous vehicle and environmental perception data, wherein the driving data comprises actual driving data and planned driving data generated by the vehicle risk model of the autonomous vehicle — S100

Setting data differences between the actual driving data and the planned driving data as a manual intervention driving data — S200

Determining a first perception data matching with the manual intervention driving data in the environmental perception data, and determining risk level information matching with the manual intervention driving data according to the first perception data — S300

Training the vehicle risk model based on the risk level information, the first perception data, the planned driving data, and the manual intervention driving data — S400

FIG. 1

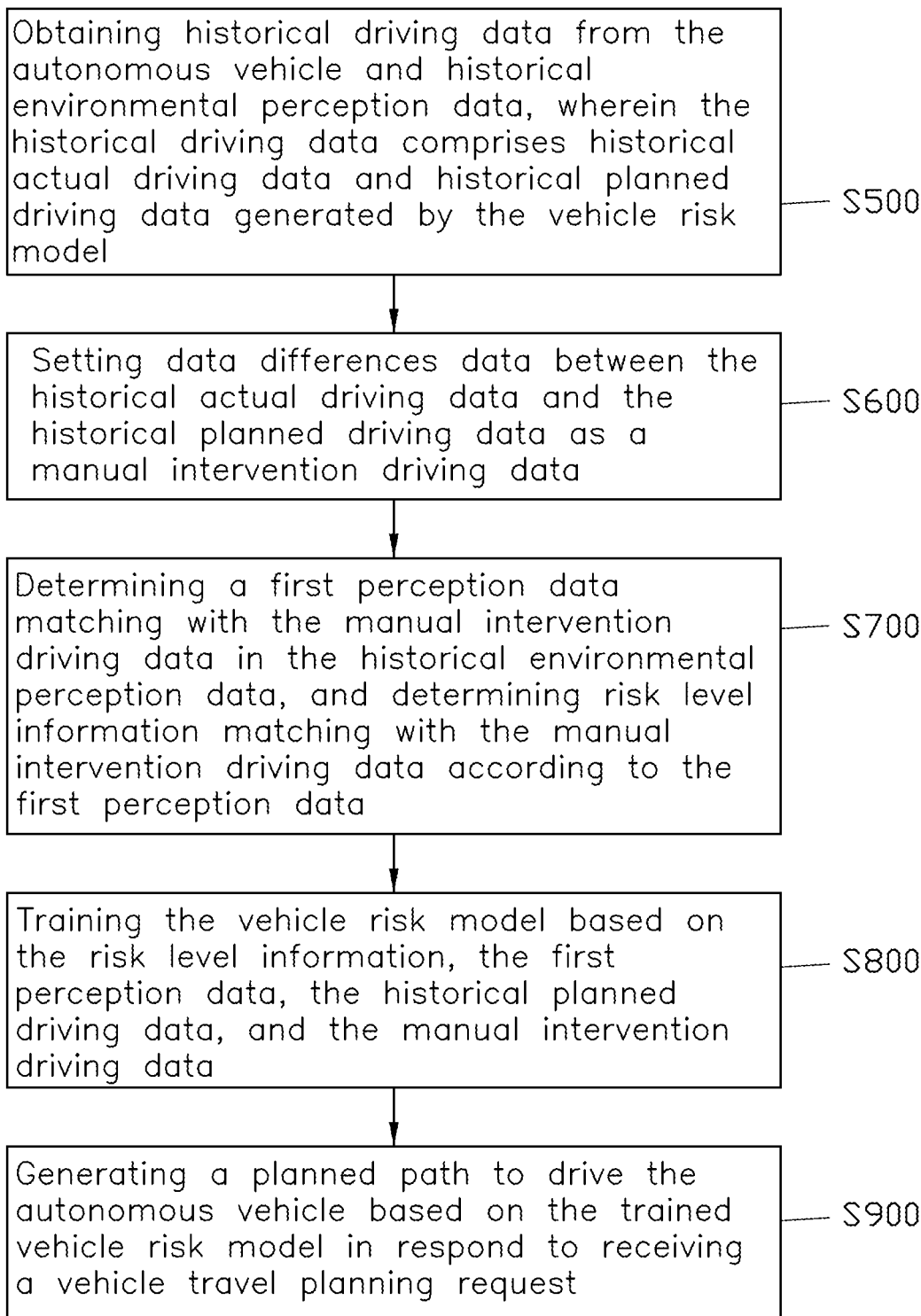

Obtaining historical driving data from the autonomous vehicle and historical environmental perception data, wherein the historical driving data comprises historical actual driving data and historical planned driving data generated by the vehicle risk model — S500

Setting data differences data between the historical actual driving data and the historical planned driving data as a manual intervention driving data — S600

Determining a first perception data matching with the manual intervention driving data in the historical environmental perception data, and determining risk level information matching with the manual intervention driving data according to the first perception data — S700

Training the vehicle risk model based on the risk level information, the first perception data, the historical planned driving data, and the manual intervention driving data — S800

Generating a planned path to drive the autonomous vehicle based on the trained vehicle risk model in respond to receiving a vehicle travel planning request — S900

FIG. 3

PATH PLANNING METHOD USING VEHICLE RISK MODEL TRAINED ON MANUAL INTERVENTION DRIVING DATA

FIELD

The subject matter herein generally relates to vehicle automatic driver field.

BACKGROUND

More and more consumers buy autonomous vehicles with a development of automatic driver field. The autonomous vehicles have autonomous driving mode or assisted driving mode.

When the autonomous vehicle is in the autonomous driving mode or the assisted driving mode, the autonomous vehicle can obtain environment information through a sensor, a driver may drive the autonomous vehicle according to the environment information thereby reducing operations by the driver and improving driving experience. However, present autonomous driving mode or assisted driving mode may not enable the driver to drive the autonomous vehicle have some problems of driving insecurity.

BRIEF DESCRIPTION OF THE DRAWINGS

Implementations of the present disclosure will now be described, by way of embodiments, with reference to the attached figures.

FIG. 1 is a flowchart illustrating an embodiment of a vehicle risk model training method according to the present disclosure.

FIG. 3 is a flowchart illustrating an embodiment of a path planning method according to the present disclosure.

DETAILED DESCRIPTION

Figure 2:
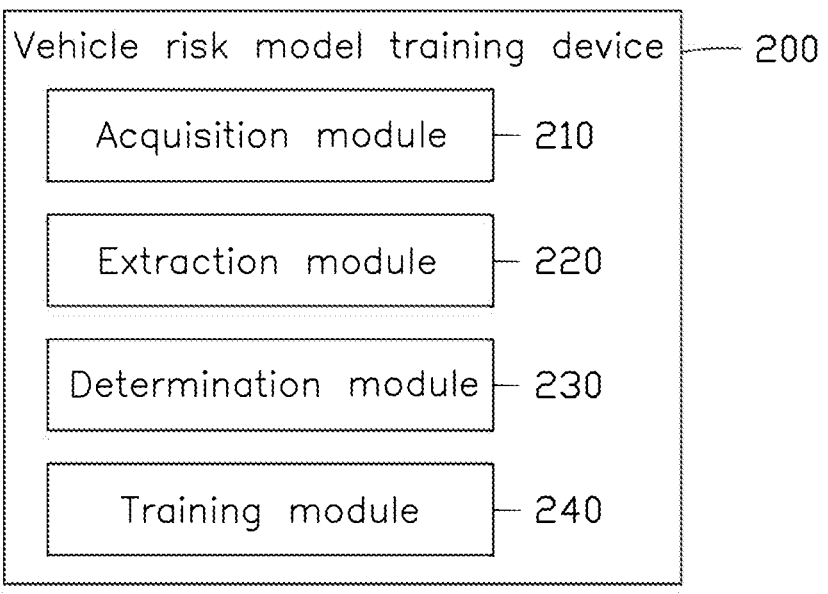
FIG. 2 is a diagram showing an embodiment of a vehicle risk model training system according to the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure. It should be noted that references to "an" or "one" embodiment in this disclosure are not necessarily to the same embodiment, and such references mean "at least one".

Several definitions that apply throughout this disclosure will now be presented.

The connection can be such that the objects are permanently connected or releasably connected. The term "comprising," when utilized, means "including, but not necessarily limited to;" it specifically indicates open-ended inclusion or membership in the so-described combination, group, series, and the like.

FIG. 1 illustrates one exemplary embodiment of a vehicle risk model training method. The flowchart presents an exemplary embodiment of the method. The exemplary method is provided by way of example, as there are a variety of ways to carry out the method. Each block shown in FIG. 1 may represent one or more processes, methods, or subroutines, carried out in the example method. Furthermore, the illustrated order of blocks is illustrative only and the order of the blocks can change. Additional blocks can be added, or fewer blocks may be utilized, without departing from this disclosure.

The vehicle risk model training method is used for a vehicle risk model training system. The vehicle risk model training system can be installed in an autonomous vehicle, the autonomous vehicle configured with a vehicle risk model training device.

In one embodiment, the autonomous vehicles, also known as driverless cars, computer-driven cars, or wheeled mobile robots, are intelligent vehicles that are driverless through computer devices. In practical applications, the autonomous vehicles rely on artificial intelligence, visual computing, radar, monitoring devices, and global positioning devices to work together, so that computer devices can automatically and safely operate motor vehicles without any active human action.

In block S100, driving data from the autonomous vehicle and environmental perception data are obtained, the driving data includes actual driving data and planned driving data generated by the vehicle risk model of the autonomous vehicle.

In one embodiment, the autonomous vehicle is installed a data collection device. The data collection device can be an in-vehicle sensor, a radar, a camera, or a global positioning system (GPS) and so on. The in-vehicle sensor detects close-range obstacles around the autonomous vehicle, such as distance perception data when the autonomous vehicle is parking. The radar detects positions and speeds of surrounding objects by emitting radio waves and measuring the radio waves' reflections. The camera captures some images to identify other vehicles, pedestrians, road signs and traffic signals. The GPS obtains real-time positioning information of vehicles and plans driving paths for vehicles.

In the embodiments, the data collection device can collect the environmental perception data centered on the autonomous vehicle within a preset range. The environmental perception data includes dynamic environmental perception data and static environmental perception data. The dynamic environmental perception data can be movement information of dynamic obstacles, traffic signal information. The static environmental perception data can be a width of a road, location information of static obstacles. The preset range can be 1 km or 1.5 km.

For example, the data collection device can collect the environmental perception data within a radius of 1 km centered on the autonomous vehicle. The environmental perception data includes driving status of other vehicles, lane information of roads, location information of road signs, and information of traffic command equipment.

In other embodiments, the data collection device can also obtain a starting position and an objective position of the autonomous vehicle. The GPS plans a planned trip according to the starting position and the objective position of the autonomous vehicle. In the embodiment, the vehicle risk model training system obtains the planned trip of the autonomous vehicle and the environmental perception data, and obtains the actual driving data of the autonomous vehicle based on the environmental perception data. The actual driving data refers to actual driving path information of the autonomous vehicle. Then, the vehicle risk model training system obtains the planned driving data generated by the vehicle risk model based on the planned trip and the vehicle risk model.

For example, the starting position is a location A, the objective position is a location B. The vehicle risk model training system obtains the planned driving data from the location A to the location B. In the embodiment, the driver drives the autonomous vehicle along the planned driving data. When the autonomous vehicle is driving, the vehicle risk model training system can obtain the environmental perception data and obtain the actual driving data based on the environmental perception data. The vehicle risk model training system obtains the planned driving data generated by the vehicle risk model of the autonomous vehicle based on the planned trip and the vehicle risk model of the autonomous vehicle.

In block S200, data differences between the actual driving data and the planned driving data are set as a manual intervention driving data.

In one embodiment, the actual driving data can include the actual driving path and actual braking information. The vehicle risk model training system can obtain the actual driving path and the actual braking information of the autonomous vehicle in real time. The actual braking information includes actual steering wheel rotation information, actual throttle information and actual braking information.

Specifically, the planned driving data includes planned driving path and planned braking information. The planned braking information includes planned steering wheel rotation information, planned throttle information and planned braking information. The vehicle risk model training system compares the actual driving path with the planned driving path and compares the actual braking information with the planned braking information. Then, the vehicle risk model training system marks first different data between the actual driving data and the planned driving data, as well as second different data between the actual braking data and the planned braking data as the manual intervention driving data.

For example, when the autonomous vehicle is driving on a first road, the first road includes a first corner. When the autonomous vehicle is approaching the first corner, a first problem happened, the autonomous vehicle does not automatically change direction at the first corner based on the planned driving data. The driver discovers the first problem and turns the steering wheel of the autonomous vehicle in time. The autonomous vehicle passes safely the first corner. The vehicle risk model training system compares the actual steering wheel rotation information with the planned steering wheel rotation information, the actual steering wheel rotation information is different from the planned steering wheel rotation information. The vehicle risk model training system compares the actual driving path with the planned driving path, the actual driving path is different from the planned driving path. The vehicle risk model training system marks the first different data between the actual driving data and the planned driving data, as well as third different data between the actual steering wheel rotation data and the planned steering wheel rotation data as the manual intervention driving data. For example, the manual intervention driving data is a rotation angle and a rotation direction of the steering wheel under manual intervention at the first corner and an actual driving position information of the autonomous vehicle at the first corner.

In one embodiment, the actual driving information, the planned driving information, the environment perception data, and the manual intervention driving data are stored into a preset database. The vehicle risk model can be trained on data from the preset database.

In block S300, a first perception data matching with the manual intervention driving data is determined in the environmental perception data, risk level information matching with the manual intervention driving data is determined according to the first perception data.

In one embodiment, the risk level information includes emergency risks and non-emergency risks. The non-emergency risks include a medium risk, a low risk, and no risk. The first perception data matching with the manual intervention driving data is determined from the dynamic environmental perception data and the static environment perception data. The vehicle risk model training system uses the first perception data to analyze the planned driving data and the manual intervention driving data, and the risk level information matching with the manual intervention driving data can be determined.

For example, in block S200, the dynamic environmental perception data at the first corner can include driving information of other vehicles and the traffic signal information, the static environment perception data at the first corner can include the rotation angle and a rotation direction of the steering wheel. The vehicle risk model training system analyzes the planned driving data (the planned driving data is driving data of the autonomous vehicle, and the autonomous vehicle does not turn at the first corner) and the manual intervention driving data (the manual intervention driving data is the actual driving data of the autonomous vehicle, and the steering wheel of the autonomous vehicle is rotated at the first corner by the driver). The first perception data is the position information of the autonomous vehicle, when the autonomous vehicle is at the first corner. The risk level information of the manual intervention driving data is determined to be the medium risk based on the first perception data.

In one embodiment, the autonomous vehicle is driving on a second road, and a driving speed of the autonomous vehicle is faster. A first position of the second road has a pothole. When the autonomous vehicle is approaching the pothole, a second problem happened, the autonomous vehicle does not reduce the driving speed to drive smoothly through the pothole based on the planned driving data. The driver discovers the second problem and steps on the foot brake in time, the autonomous vehicle drives smoothly through the pothole. The vehicle risk model training system can obtain the manual intervention driving data of the autonomous vehicle on the second road. The manual intervention driving data is a tread distance of the foot brake under the manual intervention at the pothole of the second road, and the driving speed. The vehicle risk model training system analyzes the planned driving data (the planned driving data is the driving data, when the autonomous vehicle does not reduce the driving speed at the pothole) and the manual intervention driving data (the manual intervention driving data is the actual driving data, when the foot brake of the autonomous vehicle is pressed at the pothole). The autonomous vehicle will be bumped at the pothole, if the autonomous vehicle is not controlled by the driver. The first perception data is the position information of the autonomous vehicle, when the autonomous vehicle is at the pothole. The vehicle risk model training system determined the risk level information is the low risk based on the first perception data.

In another embodiment, the autonomous vehicle is driving on a third road, the third road has a first intersection, and a road signal light at the first intersection will change from red to green. When the autonomous vehicle is approaching the first intersection, the autonomous vehicle reduces the driving speed based on the planned driving data. The driver steps on the accelerator, and the autonomous vehicle passes the first intersection just as the road signal light changed from red to green. The vehicle risk model training system can obtain the manual intervention driving data of the autonomous vehicle on the third road. The manual intervention driving data is a trampling trip of the accelerator at the first intersection. The vehicle risk model training system analyzes the planned driving data (the planned driving data is the driving data of the autonomous vehicle, when the autonomous vehicle reduces the driving speed at the first intersection) and the manual intervention driving data (the manual intervention driving data is the actual driving data, when the accelerator of the autonomous vehicle is pressed at the first intersection), If the autonomous vehicle is not controlled by the driver, the autonomous vehicle will stop at the first intersection, and then the autonomous vehicle passes through the first intersection after the road signal light has changed green to reduce the driving risk. The first perception data is some dynamic information of the road signal light. The risk level information of the manual intervention driving data is determined to be no risk based on the first perception data.

In another embodiment, the autonomous vehicle is driving on a fourth road, and a second vehicle is also driving on the fourth road, the second vehicle is in front of the autonomous vehicle. When the second vehicle brakes in an emergency, a third problem happened, the autonomous vehicle does not take emergency braking measures based on the planned driving path. The driver discovers the third problem and takes emergency braking measures in time, the autonomous vehicle passes safely the second vehicle. The vehicle risk model training system can obtain the manual intervention driving data on the fourth road. The manual intervention driving data includes the rotation angle of the steering wheel when the autonomous vehicle passes the second vehicle on the fourth road. The vehicle risk model training system analyzes the planned driving data (the planned driving data is the driving data and the location of the autonomous vehicle, when the second vehicle brakes) and the manual intervention driving data (the manual intervention driving data is the actual driving data of the autonomous vehicle under emergency braking). If the autonomous vehicle is not controlled by the driver, the autonomous vehicle will hit the second vehicle, and a driving accident will be happened. The first perception data is the position information of the second vehicle on the fourth road and some dynamic information of the autonomous vehicle during emergency braking. The risk level information of the manual intervention driving data is determined to be emergency risks based on the first perception data.

In some embodiments, when the risk level information is determined as the emergency risks, if the driver does not control the autonomous vehicle, an accident will be happened, and passengers in the autonomous vehicle will be injured or the autonomous vehicle will cause pedestrian to injure. When the risk level information is determined as the medium risk, if the driver does not control the autonomous vehicle, the autonomous vehicle will have suffered severe crashes and have high maintenance costs. When the risk level information is determined as the low risk, if the driver does not control the autonomous vehicle, the autonomous vehicle will have suffered slight crashes and have low maintenance costs. When the risk level information is determined as the no risks, if the driver does not control the autonomous vehicle, the autonomous vehicle will not cause any driving accidents and will not incur any maintenance costs.

In block S400, the vehicle risk model is trained based on the risk level information, the first perception data, the planned driving data, and the manual intervention driving data.

In some embodiments, the risk level information is detected, when the risk level information is detected as the emergency risks, the vehicle risk model is trained based on data of the first perception data matching with the emergency risks, the planned driving data and the manual intervention driving data matching with the emergency risks. For example, the risk level information corresponding to the manual intervention driving data of the autonomous vehicle driving on the fourth road is the emergency risks. The autonomous vehicle can take emergency braking measures in time to improve driving safety and protect passengers from injury when the emergency occurs. The vehicle risk model training system will immediately train the vehicle risk model based on the first perception data matching with the emergency risk, the planning driving data and the manual intervention driving data matching with the emergency risk, after the driver controls the autonomous vehicle safely pass the second vehicle. An accuracy of the planned driving data of the vehicle risk model is improved.

In some embodiments, when the risk level information is detected as the non-emergency risks, a risk priority of the risk level information is determined based on data of the first perception data matching with the non-emergency risks. Data of the manual intervention driving data matching with the non-emergency risks is sort to add to a training task list based on the risk priority. The vehicle risk model is trained based on the training task list. The non-emergency risks includes a medium risk and a low risk. The risk priority includes a first priority and a second priority, a level of the first priority is higher than a level of the second priority, the vehicle risk model training system preferentially trains the manual intervention driving data corresponding to the first priority. Specially, a risk priority of the medium risk is determined as the first priority in response to the risk level information being the medium risk, and a risk priority of the low risk is determined as the second priority in respond to the risk level information being the low risk.

In some embodiments, the manual intervention driving data matching with the first priority is extracted from the training task list, and the vehicle risk model every first preset time is trained based on the data of the first perception data matching with the first priority, the planned driving data, and the data of the manual intervention driving data matching with the first priority. The data of the manual intervention driving data matching with the second priority is extracted from the training task list, and the vehicle risk model every second preset time is trained based on the data of the first perception data matching with the second priority, the planned driving data, and the data of the manual intervention driving data matching with the second priority, a duration of the second preset time is larger than a duration of the first preset time.

For example, in block S300, the manual intervention driving data at the first corner is the medium risk. It is easy to understand the manual intervention driving data at the first corner is marked as medium-risk-manual intervention driving data, the risk priority corresponding to the medium-risk-manual intervention driving data is the first priority. The manual intervention driving data at the pothole is the low risk. The manual intervention driving data at the pothole is marked as low-risk-manual intervention driving data, the risk priority corresponding to the low-risk-manual intervention driving data is the second priority. The medium-risk-manual intervention driving data and the low-risk-manual intervention driving data are sorted and are added to the training task list.

In one embodiment, the first preset time is 48 hours, the second preset time is 7 days. The vehicle risk model training system extracts the medium-risk-manual intervention driving data from the training task list every 48 hours, and trains the vehicle risk model based on the medium-risk-manual intervention driving data, the first perception data and the planned driving data. The vehicle risk model training system extracts the low-risk-manual intervention driving data from the training task list every 7 days, and trains the vehicle risk model based on the low-risk-manual intervention driving data, the first perception data and the planned driving data. A safety of the planned driving path planned by the vehicle risk model is improved and an occurrence of driving accidents is avoided.

In the embodiment, the risk priority also includes a third priority. The level of the second priority is higher than a level of the third priority. For example, in block S300, the manual intervention driving data at the first intersection is no risks. The manual intervention driving data at the first intersection is marked as no-risk-manual intervention driving data, the risk priority corresponding to the no-risk-manual intervention driving data is the third priority. The medium-risk-manual intervention driving data, the low-risk-manual intervention driving data and the no-risk-manual intervention driving data are sorted and are added to the training task list.

The vehicle risk model training system extracts the no-risk-manual intervention driving data from the training task list every a third preset time, and trains the vehicle risk model based on the no-risk-manual intervention driving data, the environmental perception data and the planning driving data. For example, the third preset time is one month.

During the driving process of the autonomous vehicle, the vehicle risk model training system obtains the manual intervention driving data. The vehicle risk model training system determines the risk level of the manual intervention driving data. When the risk level information of the manual intervention driving data is emergency risks, the vehicle risk model is immediately trained based on the first perception data, the planned driving data and the manual intervention driving data. When the risk level information of the manual intervention driving data is non-emergency risks, the manual intervention driving data is sorted to add to the training task list. Then, the manual intervention driving data with different priority levels are extracted from the training task list at preset intervals. Finally, the vehicle risk model is trained based on the first perception data, the planned driving data and the manual intervention driving data. When the risk level information corresponding to the manual intervention driving data is not high, the vehicle risk model is trained every preset time to reduce the cost of model training.

Please refer to FIG. 2, FIG. 2 shows a vehicle risk model training device 200. The vehicle risk model training device 200 includes an acquisition module 210, an extraction module 220, a determination module 230 and a training module 240. The acquisition module 210 obtains the driving data from the autonomous vehicle and the environmental perception data, the driving data includes the actual driving data and the planned driving data generated by the vehicle risk model of the autonomous vehicle. The extraction module 220 sets the data differences between the actual driving data and the planned driving data as the manual intervention driving data. The determination module 230 determines the first perception data matching with the manual intervention driving data in the environmental perception data and determines the risk level information matching with the manual intervention driving data according to the first perception data. The training module 240 trains the vehicle risk model based on the risk level information, the first perception data, the planned driving data, and the manual intervention driving data.

In one embodiment, each module (the acquisition module 210, the extraction module 220, the determination module 230, and the training module 240) may include one or more software programs in the form of computerized codes stored in a data storage. The computerized codes can include instructions that can be executed by a processor to implement the above-function of each module.

FIG. 3 illustrates one exemplary embodiment of a path planning method. The path planning method is used for the vehicle risk model training system. The path planning method may include five blocks.

In block S500, historical driving data from the autonomous vehicle and historical environmental perception data are obtained, the historical driving data includes historical actual driving data and historical planned driving data generated by the vehicle risk model of the autonomous vehicle.

In block S600, different data between the historical actual driving data and the historical planned driving data is set as a manual intervention driving data.

In block S700, a first perception data matching with the manual intervention driving data in the historical environmental perception data is determined, and risk level information matching with the manual intervention driving data is determined according to the first perception data.

In block S800, the vehicle risk model is trained based on the risk level information, the first perception data, the historical planned driving data, and the manual intervention driving data.

In block S900, a planned path is generated to drive the autonomous vehicle based on the trained vehicle risk model in respond to receiving a vehicle travel planning request.

In one embodiment, when the autonomous vehicle receives a vehicle travel planning request, a planned path is generated based on the trained vehicle risk model, and the autonomous vehicle can be drove by the planned path.

Figure 4:
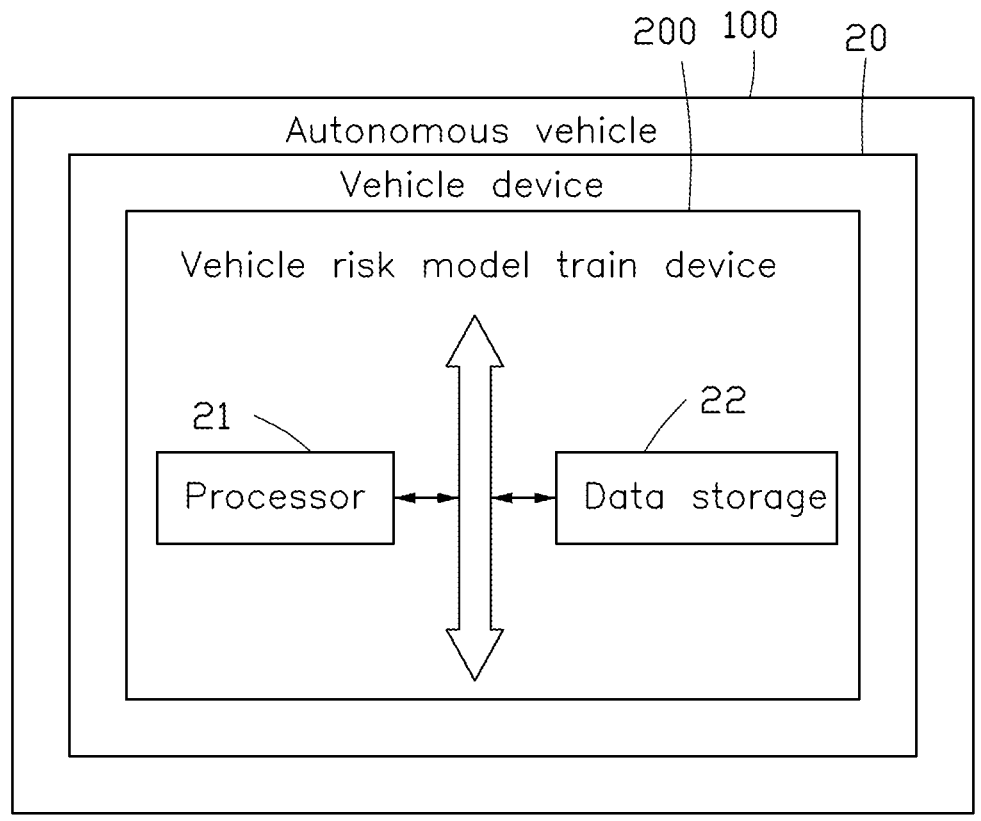
FIG. 4 is a diagram showing modules illustrating a vehicle device.

As shown in FIG. 4, one exemplary embodiment of an vehicle device 20 comprises at least one processor 21 and a data storage 22. The data storage 22 stores one or more programs which can be executed by the at least one processor 21. The data storage 22 is used to store instructions, and the processor 21 is used to call up instructions from the data storage 22, so that the vehicle device 20 performs the steps of the vehicle risk model training method in the above embodiment. The vehicle devices 20 can be desktop computers, laptops, handheld computers, cloud servers and other computing devices. The vehicle devices 20 can interact with users through keyboard, mouse, remote control, touchpad or voice control devices.

In one embodiment, the vehicle devices 20 applied to an autonomous vehicle 100, the autonomous vehicle 100 configured with a vehicle risk model training device 200.

In one embodiment, a non-transitory storage medium recording instructions is disclosed. When the recorded computer instructions are executed by a processor of an vehicle device 20, the vehicle device 20 can perform the method.

The embodiments shown and described above are only examples. Many details known in the field are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A path planning method applied to an autonomous vehicle, the autonomous vehicle configured with a vehicle risk model, the path planning method comprising:

obtaining historical driving data from the autonomous vehicle and historical environmental perception data, wherein the historical driving data comprises historical actual driving data and historical planned driving data generated by the vehicle risk model;

setting data differences between the historical actual driving data and the historical planned driving data as manual intervention driving data;

determining first perception data matching with the manual intervention driving data in the historical environmental perception data, and determining risk level information matching with the manual intervention driving data according to the first perception data;

detecting whether the risk level information indicates an emergency risk or a non-emergency risk;

in response to the risk level information indicating the emergency risk, training the vehicle risk model based on the risk level information, the first perception data, the historical planned driving data, and the manual intervention driving data;

in response to the risk level information indicating the non-emergency risk, assigning a first priority to the manual intervention driving data when the non-emergency risk is a medium risk, or assigning a second priority to the manual intervention driving data when the non-emergency risk is a low risk, wherein a level of the first priority is higher than a level of the second priority; sorting the manual intervention driving data based on the assigned priority, and adding the manual intervention driving data to a training task list; and training the vehicle risk model according to the training task list, wherein the manual intervention driving data having the first priority is extracted from the training task list for training the vehicle risk model every first preset interval, and the manual intervention driving data having the second priority is extracted from the training task list for training the vehicle risk model every second preset interval, the second preset interval is longer than the first preset interval; and generating a planned path to drive the autonomous vehicle based on the trained vehicle risk model in response to receiving a vehicle travel planning request.

2. The path planning method of claim 1, wherein determining the risk level information according to the first perception data comprises:

determining the emergency risk in response to the first perception data indicating that, without manual intervention, a collision would occur; and determining the non-emergency risk in response to the first perception data indicating that, without manual intervention, the autonomous vehicle would experience a non-collision driving anomaly.

3. The path planning method of claim 1, wherein the manual intervention driving data comprises at least one of: a rotation angle and a rotation direction of a steering wheel under manual intervention, a tread distance of a foot brake under manual intervention, and a trampling trip of an accelerator under manual intervention.

4. The path planning method of claim 1, wherein the first perception data comprises at least one of:

dynamic environmental perception data and static environmental perception data, wherein the dynamic environmental perception data comprises movement information of dynamic obstacles and traffic signal information, the static environmental perception data comprises a width of a road and location information of static obstacles.

\* \* \* \* \*